(12) United States Patent
Herbeck

(10) Patent No.: US 8,867,695 B2
(45) Date of Patent: Oct. 21, 2014

(54) CLOCK SIGNAL RATE MANAGEMENT CIRCUIT

(71) Applicant: Apple Inc., Cupertino, CA (US)

(72) Inventor: Gilbert Herbeck, Livermore, CA (US)

(73) Assignee: Apple Inc., Cupertino, CA (US)

( * ) Notice: Subject to any disclaimer, the term of this patent is extended or adjusted under 35 U.S.C. 154(b) by 57 days.

(21) Appl. No.: 13/750,192

(22) Filed: Jan. 25, 2013

(65) Prior Publication Data

US 2014/0211906 A1    Jul. 31, 2014

(51) Int. Cl.
H03K 21/00    (2006.01)
H03K 23/00    (2006.01)

(52) U.S. Cl.
CPC ....................... *H03K 23/00* (2013.01)
USPC ................................ 377/47; 377/48

(58) Field of Classification Search
None
See application file for complete search history.

(56) References Cited

U.S. PATENT DOCUMENTS

| | | | | |
|---|---|---|---|---|
| 4,443,887 A | * | 4/1984 | Shiramizu | 377/110 |
| 4,596,027 A | * | 6/1986 | Bernardson | 377/33 |
| 4,692,640 A | * | 9/1987 | Suzuki et al. | 326/11 |
| 5,249,214 A | * | 9/1993 | Ulmer et al. | 377/121 |
| 5,365,119 A | * | 11/1994 | Kivari | 327/115 |
| 6,700,425 B1 | * | 3/2004 | Pilling | 327/291 |
| 6,759,886 B2 | * | 7/2004 | Nakanishi | 327/295 |
| 7,652,517 B2 | | 1/2010 | Corcelli | |
| 8,217,824 B2 | * | 7/2012 | Hernes et al. | 341/161 |
| 8,253,498 B2 | | 8/2012 | Yagishita et al. | |
| 8,290,113 B2 | | 10/2012 | Marienborg et al. | |
| 8,299,729 B2 | | 10/2012 | Scenini et al. | |
| 2011/0311018 A1 | * | 12/2011 | Chen et al. | 377/47 |

FOREIGN PATENT DOCUMENTS

| | | | |
|---|---|---|---|
| JP | 56-169432 | * | 12/1981 |
| JP | 57-7634 | * | 1/1982 |

* cited by examiner

*Primary Examiner* — Tuan T Lam

(74) *Attorney, Agent, or Firm* — Lawrence J. Merkel; Meyertons, Hood, Kivlin, Kowert & Goetzel, P.C.

(57) ABSTRACT

A prescalar counter may be configured to repeatedly increment once for each cycle of a clock signal at a first frequency and reset upon reaching a threshold counter value. The prescalar counter may also include toggling logic configured to generate a clock pulse of a global time base signal upon each reset of the prescalar counter. A frequency divider may be configured to divide the global time base signal into a plurality of separate clock signals with each of the separate clock signals having a different frequency. The frequency divider may also be configured to provide, to each of a plurality of timers, one of the separate clock signals.

22 Claims, 4 Drawing Sheets

CLOCK SIGNAL RATE MANAGEMENT CIRCUIT

BACKGROUND

1. Technical Field

This disclosure relates generally to clock signal management, and more particularly to apparatus, devices, methods, and processors for managing clock rates for a number of timers.

2. Description of the Related Art

In recent years, mobile devices such as smart phones and tablet computers have become increasingly sophisticated. In addition to supporting telephone calls, many mobile devices now provide access to the internet, email, text messaging, and navigation using the global positioning system (GPS). Mobile devices that support such sophisticated functionality often include many components. In such mobile devices, one component, such as a processor, may be configured to monitor the 'health' or activity of such components to ensure that all components are operating in an expected manner. In such embodiments, the processor may maintain a separate timer (such as a timeout counter) for each component. During a period of inactivity, the timer runs until one of two actions occur: the timer runs for a predefined period of time (the counter increments until reaching a threshold counter value) or the component becomes active. In the latter case, the timer restarts. In the former case, the lack of activity for the predefined period of time may indicate a failure of the component and the timer may provide an asynchronous interrupt to the processor.

Each timer is generally implemented as a counter and all counters are generally implemented as the same size. For example, in some prior art systems, a processor may maintain many 32-bit timeout counters, each of which increments on the same clock rate. The time of inactivity of a component that indicates a component's failure, however, may vary from component to component. A Bluetooth device, for example, may be inactive far longer than a cache or memory bus before such inactivity represents a failure. As such, counters of the same size for each device are an inefficient utilization of area and inefficiently consume power.

SUMMARY

Various example methods and apparatus are disclosed. Example methods may include providing, by a prescalar counter, a global time base signal. Providing such a global time base signal may include, repeatedly incrementing the prescalar counter once for each cycle of a clock signal at a first frequency and resetting the prescalar counter upon reaching a threshold counter value. Such methods may also include generating a clock pulse of the global time base signal upon each reset of the prescalar counter; dividing, by a frequency divider, the global time base signal into a plurality of separate clock signals, with each of the separate clock signals having a different frequency; and providing, to each of a plurality of timers, one of the separate clock signals.

Also disclosed are apparatus that may include a prescalar counter configured to repeatedly increment once for each cycle of a clock signal at a first frequency and reset upon reaching a threshold counter value, where the prescalar counter includes toggling logic configured to generate a clock pulse of a global time base signal upon each reset of the prescalar counter. Such apparatus may also include a frequency divider configured to divide the global time base signal into a plurality of separate clock signals, with each of the separate clock signals having a different frequency, and provide, to each of a plurality of timers, one of the separate clock signals.

Figure 1:
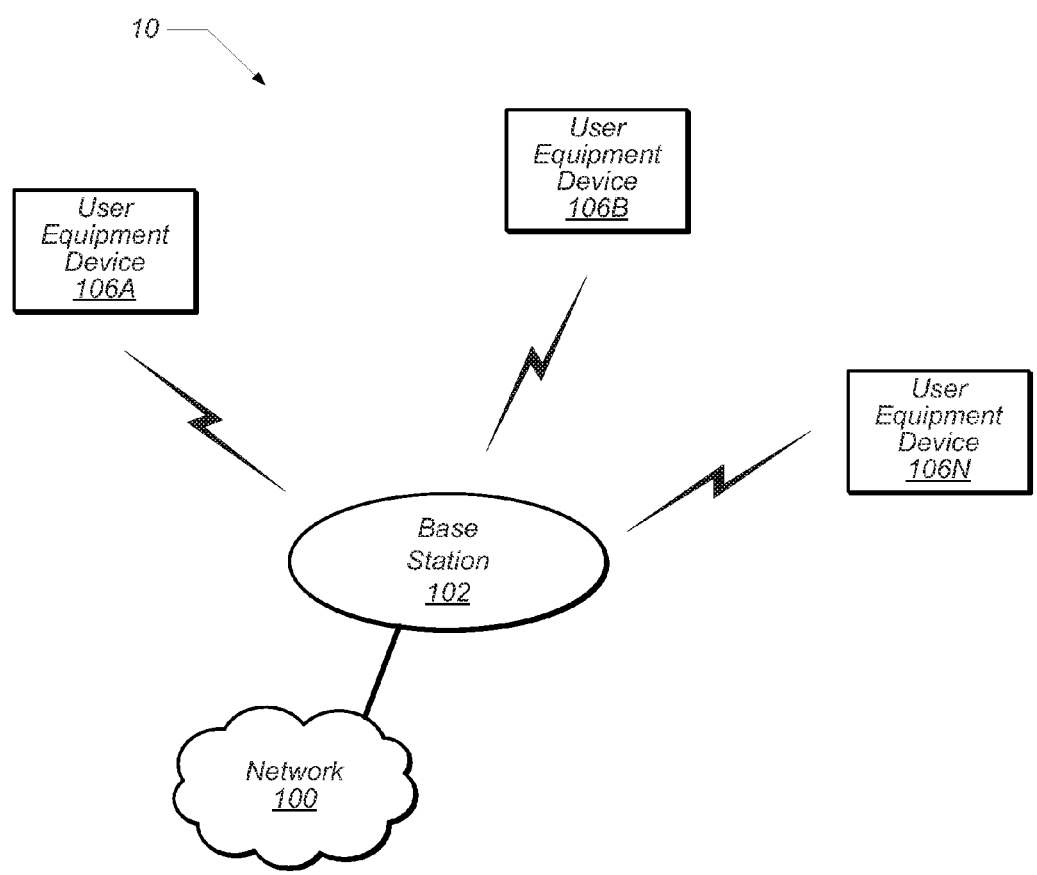
FIG. 1 sets forth a block diagram of one embodiment of a wireless communication system.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

FIG. 1 sets forth a block diagram of one embodiment of a wireless communication system. The system of FIG. 1 is one example of any of a variety of wireless communication systems. The wireless communication system 10 includes a base station 102 which communicates over a wireless transmission medium such as, for example, an over the air interface with one or more user equipment (UE) devices, 106A through 106N. The base station 102 is also coupled a network 100 via another interface, which may be wired or wireless. Components identified by reference designators that include both a number and a letter may be referred to by the only a number where appropriate.

The base station 102 may be a base transceiver station (BTS) or cell site, and may include hardware that enables wireless communication with one or more of the UEs 106. The base station 102 may also be equipped to communicate with the network 100. Thus, the base station 102 may facilitate communication between the UEs 106 and/or between the UEs 106 and the network 100. The communication area (or coverage area) of the base station 102 may be referred to as a "cell." In various embodiments, the base station 102 and the UEs may be configured to communicate over the transmission medium using any of various wireless communication radio access technologies such as LTE, eHRPD, GSM, CDMA, WLL, WAN, WiFi, WiMAX, etc. In embodiments that communicate using the eHRPD standard, the BTS 102 may be referred to as an HRPD BTS, and the network 100 may include an eAN/ePCF and a number of gateways including HRPD gateway (HSGW), a PDN gateway (P-GW), and a number of policy and packet control functions that may be associated with a service provider, for example.

In one embodiment, each of the UEs 106A-106N may be representative of a device with wireless network connectivity such as a mobile phone, a hand-held device, a computer or a tablet, or virtually any type of wireless device. As described further below, the UE 106 may include at least one processor that is configured to execute program instructions stored in a memory. Accordingly, in some embodiments, the UE 106 may perform one or more portions of the functionality described below by executing such stored instructions. However, in other embodiments, the UE 106 may include one or more hardware elements and/or one or more programmable hardware elements such as an FPGA (field-programmable gate array) that may be configured to perform the one or more portions the functionality described below. In still other embodiments, any combination of hardware and software may be implemented to perform the functionality described below.

In the system 10 of FIG. 1, any of the UEs 106 may include a processor configured to monitor the health or activity of other components of the UE 106. For each component, the processor may include a timer that operates on a clock signal. Rather than each timer being of the same size and operating on the same clock signal, each timer maintained by the processor of the UE 106 may be provided a separate clock signal at a frequency different than other timers' clock signals and be sized as appropriate for the component associated with the timer. That is, components in which inactivity for a relatively short period of time indicates a failure may be associated with a timer that is larger and runs on a higher frequency clock signal than timers associated with components for which inactivity for a relatively longer period of time indicates a failure.

To that end, the UE 106 may include a prescalar counter configured to repeatedly increment once for each cycle of a clock signal at a first frequency and reset upon reaching a threshold counter value. The prescalar counter may include toggling logic configured to generate a clock pulse of a global time base signal upon each reset of the prescalar counter. The UE 106 may also include a frequency divider that is configured to divide the global time base signal into a number of separate clock signals, with each of the separate clock signals having a different frequency. The frequency divider may also provide a different one of the separate clock signals to each separate timer.

Figure 2:
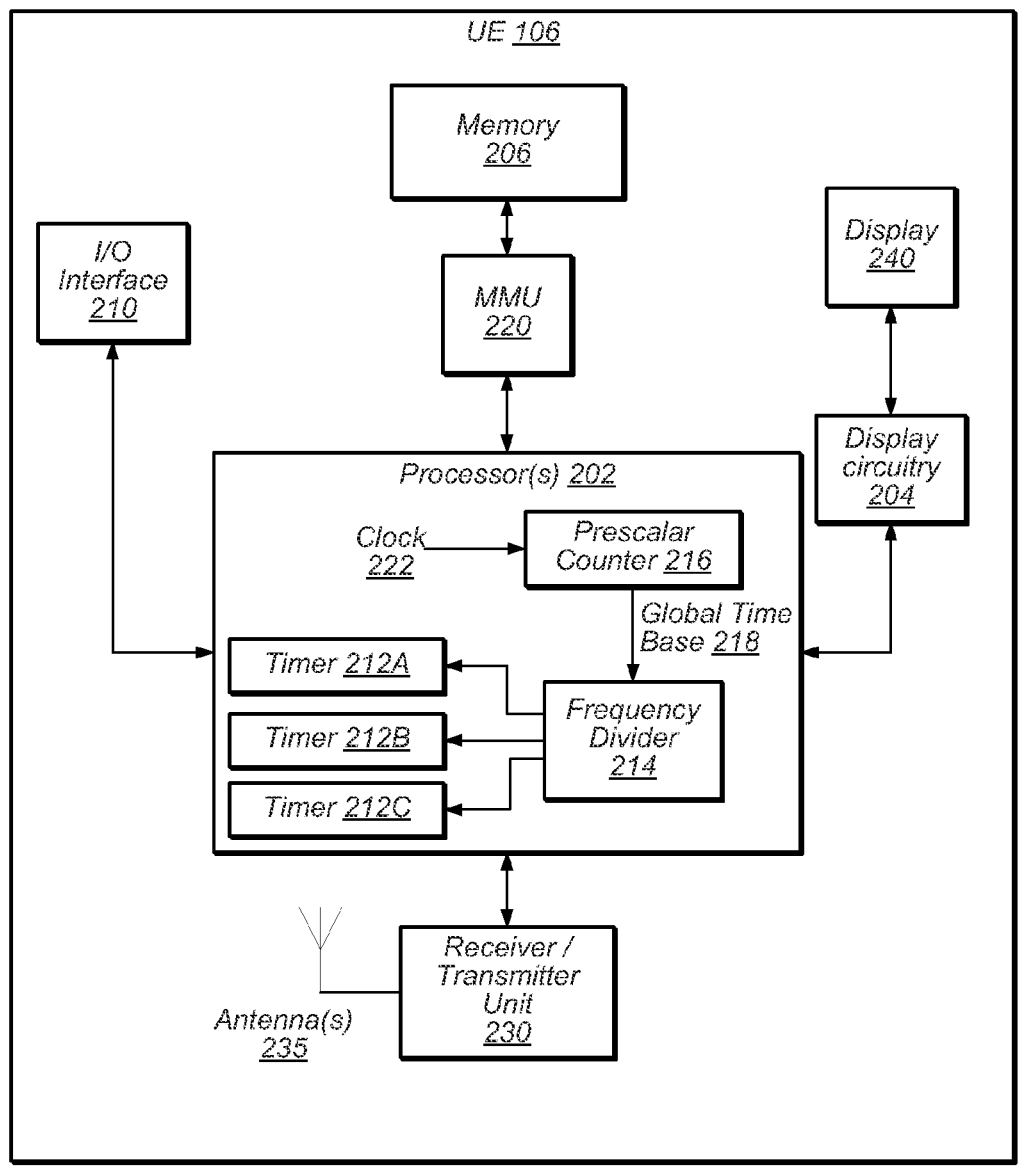
FIG. 2 sets forth a block diagram of one embodiment of a wireless communication device shown in FIG. 1.

For further explanation, FIG. 2 sets forth a block diagram of one embodiment of a wireless communication device shown in FIG. 1. The UE 106 includes one or more processors 202 (or one or more processor cores 202) which are coupled to display circuitry 204 which is in turn coupled to the display 240. The display circuitry 204 may be configured to perform graphics processing and provide display signals to the display 240.

The one or more processors 202 are also coupled to a memory management unit (MMU) 220 and to a receiver/transmitter (R/T) unit 230. The MMU 220 is coupled to a memory 206. The UE 106 also includes an I/O interface 210 that is coupled to the processor(s) 202, and may be used for coupling the UE 106 to a computer system, or other external device. It is noted that in one embodiment the components shown within UE 106 of FIG. 2 may be manufactured as standalone components. In other embodiments, however, various ones of the components may be part of one or more chipsets or part of a system on chip (SOC) implementation.

In various embodiments, the processors 202 may be representative of a number of different types of processors that may be found in a wireless communication device. For example, the processors 202 may include general processing capability, digital signal processing capability, as well as hardware accelerator functionality, as desired. The processors 202 may include baseband processing and therefore may digitally process the signals received by the R/T unit 230. The processors 202 may also process data that may be transmitted by the R/T unit 230. The processors 202 may also perform a number of other data processing functions such as running an operating system and user applications for the UE 106.

In one embodiment, the MMU 220 may be configured to receive addresses from the one or more processors 202 and to translate those addresses to locations in memory (e.g., memory 206) and/or to other circuits or devices, such as the display circuitry 204, R/T unit 230, and/or display 240. The MMU 220 may also return data to one or more of the processors 202 from the locations in memory 206. The MMU 220 may be configured to perform memory protection and page table translation or set up. In some embodiments, the MMU 220 may be included as a portion of one or more of the processors 202.

The R/T unit 230 may, in one embodiment, include analog radio frequency (RF) circuitry for receiving and transmitting RF signals via the antenna 235 to perform the wireless communication. The R/T unit 230 may also include down-conversion circuitry to lower the incoming RF signals to the baseband or intermediate frequency (IF) as desired. For example, the R/T unit 230 may include various RF and IF filters, local oscillators, mixers, and the like. Since the UE 106 may operate according to a number of radio access technologies, the R/T unit 230 may include a corresponding number of RF front end portions to receive and down-convert, as well as up-convert and transmit the respective RF signals of each technology.

In some embodiments, the processor 202 of the example UE 106 of FIG. 2 may include a number of timers 212A, 212B, and 212C. Each timer 212A, 212B, 212C may be associated with one of the components of the UE and may be utilized to track the activity (or inactivity) of the component. When components of the UE are combined and implemented as a system-on-chip, timers may be associated with on-chip or off-chip I/O devices. Timer 212A, for example, may be associated with the I/O interface 210. The timer may be configured to incrementally count from zero to a predefined threshold counter value, unless interrupted by the I/O interface 210. If interrupted, the timer 212A may reset to zero and begin incrementing again. If not interrupted, the timer 212A may reach the predefined threshold counter value and provide an interrupt to an interrupt controller (not shown here) of the processor. Such an interrupt informs the processor that a period of inactivity has lapsed for the I/O interface 210.

Each timer 212 in the example of FIG. 2 operates on a clock signal. The clock signal may be provided by a prescalar counter 216 and a frequency divider 214. The example prescalar counter 216 may be configured to repeatedly increment once for each cycle of a clock signal 222 at a first frequency and reset upon reaching a threshold counter value. The clock signal 222 in some instances may be the slowest available clock signal. In some embodiments, the prescalar counter includes toggling logic (not shown here) configured to generate a clock pulse of a global time base signal 218 upon each reset of the prescalar counter. In this way, the prescalar counter receives a clock signal at a first frequency and effectively provides a derived version of that clock signal at a lower frequency as the global time base signal 218. The global time base signal is referred to as such because the signal is provided to a frequency divider from which clock signals for all timers 212A, 212B, 212C are generated.

The example frequency divider 214 of FIG. 2 may be configured to divide the global time base signal 218 into a number of separate clock signals with each of the separate clock signals having a different frequency and provide, to each of a plurality of timers, one of the separate clock signals. It is noted that, while the frequency divider may divide the global time base signal 218 into a number of different clock signals, not every timer 212 need receive a different clock signal. In some instances, for example, timer 212A and 212B may receive the same clock signal (a clock signal having the same frequency) while timer 212C receives a different clock signal (a clock signal having a different frequency than the clock signals received by 212A and 212B). By prescaling and dividing a clock signal 222 into a number of different frequency clock signals, each timer may operate at a rate that corresponds to a preferred period of inactivity—timers associated with components that may be inactive for a relatively long period of time prior to an indication of failure may operate on a lower frequency clock signal than timers associated with components that may be inactive for a relatively shorter period of time prior to an indication of failure. As such, timers that operate on a lower clock frequency may also be shorter in length (fewer bits) that those that operate on a higher clock frequency.

Figure 3:
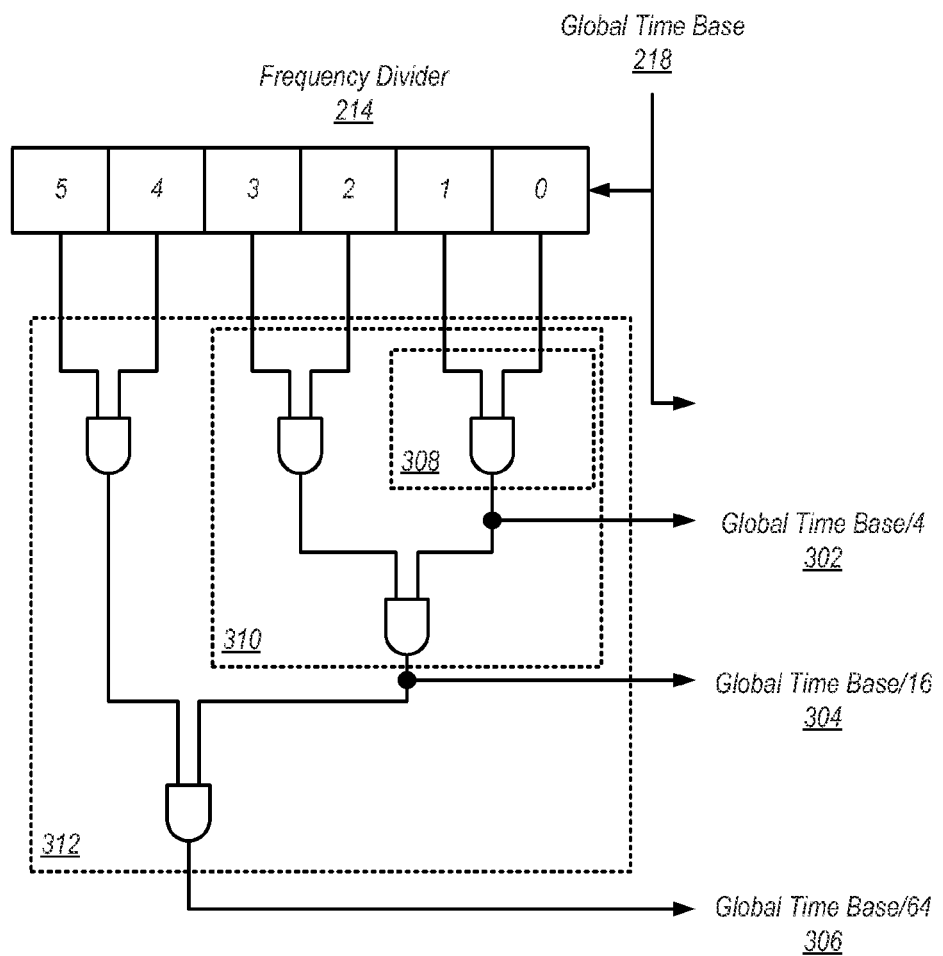
FIG. 3 sets forth a block diagram of an example clock divider circuit for managing clock rates of a plurality of timers.

For further explanation, FIG. 3 sets forth a block diagram of an example clock divider circuit. The example clock divider circuit of FIG. 3 may include a six bit frequency divider 214 and a number of AND trees 308, 310, 312. An AND tree may be formed by one or more AND gates (or other logical AND structure).

A first AND tree 308, is coupled to the first and second bits (bits 0 and 1) of the counter in the example of FIG. 3. As such, when the counter 214 increments four times (00, 01, 10, 11), the AND tree 308 toggles from a logic low to a logic high. Thus, the AND tree 308 provides a clock signal having a frequency equal to that of the global time base signal divided by four. In a similar manner, the AND tree 310 may be configured to provide a clock signal 304 having a frequency equal to that of the global time base signal 218 divided by sixteen and the AND tree 312 may be configured to provide a clock signal 306 having a frequency equal to that of the global time base signal 218 divided by sixty four.

It is noted that, although a six bit counter is depicted in the example of FIG. 3 as an example frequency divider, with separate clock signals having frequencies equal to one fourth the global time base signal frequency, one sixteenth the global time base signal frequency, and one sixty fourth the global time base signal frequency, different size counters may be utilized to implement a frequency divider 214.

Figure 4:
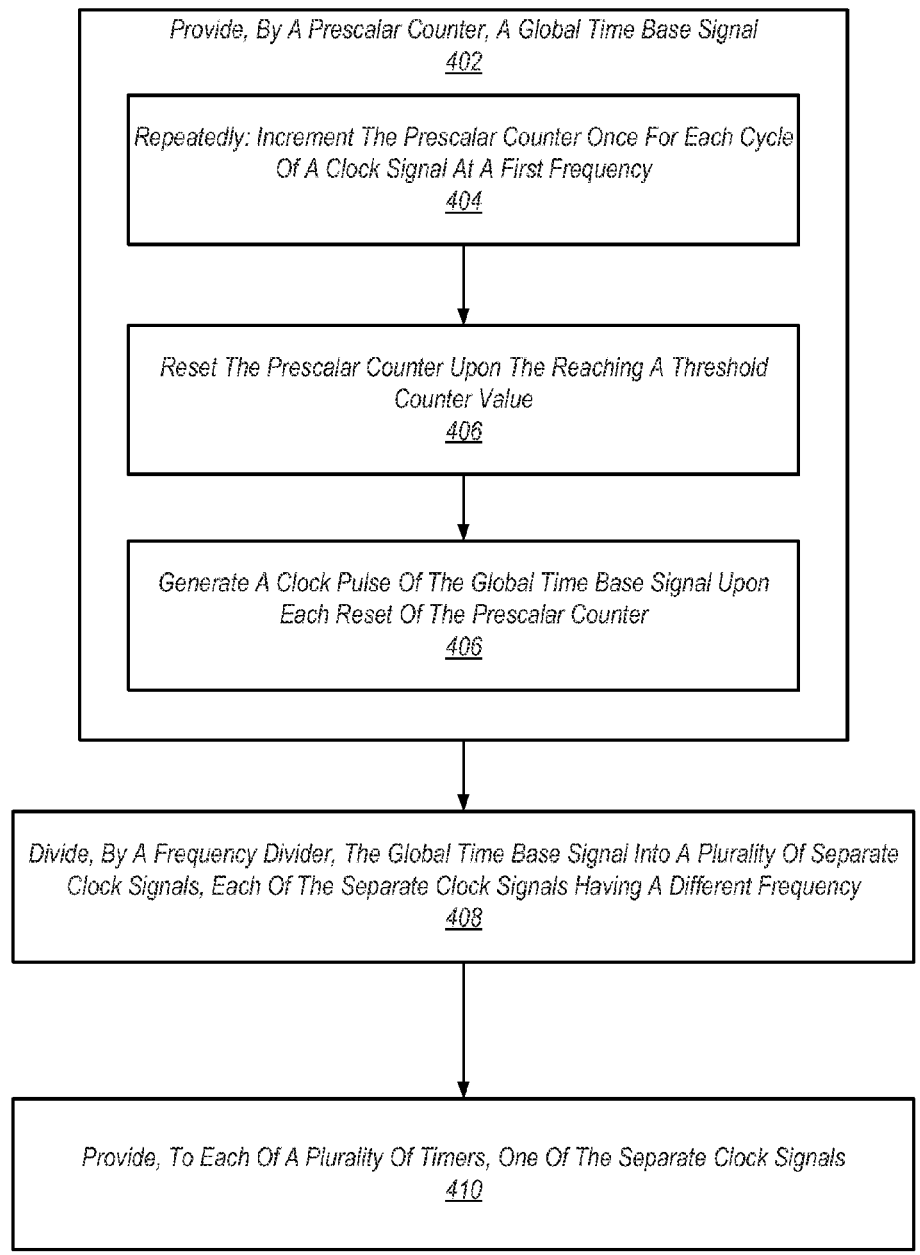
FIG. 4 sets forth a flowchart illustrating an example method of managing clock rates of a plurality of timers.

For further explanation, FIG. 4 sets forth a flowchart illustrating an example method of managing clock rates of a plurality of timers. The method of FIG. 4 includes providing 402, by a prescalar counter, a global time base signal. Providing 402 a global time base signal may be carried out by repeatedly incrementing 404 the prescalar counter once for each cycle of a clock signal at a first frequency, resetting 406 the prescalar counter upon reaching a threshold counter value, and generating a clock pulse of 406 the global time base signal upon each reset of the prescalar counter. In some embodiments, the first frequency at which the prescalar counter is incremented may be a lowest available clock frequency.

The method of FIG. 4 also includes dividing 408, by a frequency divider, the global time base signal into a plurality of separate clock signals and providing 410, to each of a plurality of timers, one of the separate clock signals. In the method of FIG. 4, each of the separate clock signals may have a different frequency. In some embodiments, the frequency divider may be implemented as a multi-bit counter (such as the frequency divider in the example of FIG. 3) with a number of AND trees configured to combine sets of bits of the frequency divider. In such an embodiment, dividing 408 the global time base signal into a plurality of separate clock signals may include providing an output of each AND tree as the frequency divider (counter) increments. In some embodiments, the frequency divider may be configured to provide 410 to at least one of the timers, the global time base signal.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
   a prescalar counter configured to repeatedly increment once for each cycle of a clock signal at a first frequency and reset upon reaching a threshold counter value, wherein the prescalar counter further comprises toggling logic configured to generate a clock pulse of a global time base signal upon each reset of the prescalar counter; and
   a frequency divider configured to divide the global time base signal into a plurality of separate clock signals with each of the separate clock signals having a different frequency and provide, to each of a plurality of timers, one of the separate clock signals, and wherein each of the plurality of timers is associated with one of a plurality of components in a system that includes the apparatus, and wherein a first clock signal of the plurality of separate clock signals is provided to a first timer of the plurality of timers, the first clock signal having a frequency that is based on a first period of time corresponding to a first component of the plurality of components, wherein the first component is associated with the first timer, and wherein the first period of time, when elapsing without activity from the first component, indicates a potential failure of the first component, and wherein the first timer is configured to interrupt a processor in the system responsive to the first timer reaching the first period of time.

2. The apparatus of claim 1 wherein the frequency divider further comprises a multi-bit counter and a plurality of AND trees, with each AND tree configured to combine one or more bits of the frequency divider and provide one of the separate clock signals based on the combined bits.

3. The apparatus of claim 1 wherein the frequency divider further comprises a counter having at least six bits and is configured to divide the global time base signal into:
   a first clock signal having a frequency equal to the global time base signal divided by four;
   a second clock signal having a frequency equal to the global time base signal divided by sixteen; and
   a third clock signal having a frequency equal to the global time base signal divided by sixty four.

4. The apparatus of claim 1 wherein the plurality of components include one or more I/O ('input/output') devices of a system-on-chip.

5. The apparatus of claim 4 wherein the I/O devices comprise on-chip devices.

6. The apparatus of claim 4 wherein the I/O devices comprise off-chip devices.

7. The apparatus of claim 1 wherein the toggling logic is further configured to provide, to at least one of the timers, the global time base signal.

8. The apparatus of claim 1 wherein the prescalar counter operates at a lowest available clock frequency.

9. A device comprising:
   a processor configured with a plurality of timers;
   a plurality of components coupled to the processor; and
   a clock divider circuit coupled to the processor, the clock divider circuit comprising:
      a prescalar counter configured to repeatedly increment once for each cycle of a clock signal at a first frequency and reset upon reaching a threshold counter value, wherein the prescalar counter further comprises toggling logic configured to generate a clock pulse of a global time base signal upon each reset of the prescalar counter; and
      a frequency divider configured to divide the global time base signal into a plurality of separate clock signals with each of the separate clock signals having a different frequency and provide, to each of the plurality of timers, one of the separate clock signals, and wherein each of the plurality of timers is associated with one of the plurality of components, and wherein a first clock signal of the plurality of separate clock signals is provided to a first timer of the plurality of timers, the first clock signal having a frequency that is based on a first period of time corresponding to a first component of the plurality of components, wherein the first component is associated with the first timer, and wherein the first period of time, when elapsing without activity from the first component, indicates a potential failure of the first component, and wherein the first timer is configured to interrupt the processor responsive to the first timer reaching the first period of time.

10. The device of claim 9 wherein the frequency divider further comprises a multi-bit counter and a plurality of AND trees, with each AND tree configured to combine one or more sets of bits of the frequency divider and provide one of the separate clock signals based on the combined sets of bits.

11. The device of claim 9 wherein the frequency divider comprises a counter having at least six bits and is further configured to divide the global time base signal into:
   a first clock signal having a frequency equal to the global time base signal divided by four;
   a second clock signal having a frequency equal to the global time base signal divided by sixteen; and
   a third clock signal having a frequency equal to the global time base signal divided by sixty four.

12. The device of claim 9 wherein the toggling logic is further configured to provide, to at least one of the timers, the global time base signal.

13. The device of claim 9 wherein the prescalar counter operates at a lowest available clock frequency.

14. The device of claim 9 wherein the device is a mobile device.

15. A method comprising:
   providing, by a prescalar counter, a global time base signal, including repeatedly incrementing the prescalar counter once for each cycle of a clock signal at a first frequency, resetting the prescalar counter upon reaching a threshold counter value, and generating a clock pulse of the global time base signal upon each reset of the prescalar counter;
   dividing, by a frequency divider, the global time base signal into a plurality of separate clock signals, each of the separate clock signals having a different frequency;
   providing, to each of a plurality of timers, one of the separate clock signals, and wherein each of the plurality of timers is associated with one of a plurality of components in a system, and wherein a first clock signal of the plurality of separate clock signals is provided to a first timer of the plurality of timers, the first clock signal having a frequency that is based on a first period of time corresponding to a first component of the plurality of components, wherein the first component is associated with the first timer, and wherein the period of time, when elapsing without activity from the first component, indicates a potential failure of the first component; and
   the first timer interrupting a processor in the system responsive to the first timer reaching the first period of time.

16. The method of claim 15 wherein:
   the frequency divider comprises a multi-bit counter; and
   dividing the global time base signal into a plurality of separate clock signals further comprise combining, with a plurality AND trees, one or more sets of bits of the frequency divider, wherein an output of each AND tree comprises one of the separate clock signals.

17. The method of claim 16 wherein:
   the frequency divider comprises a counter having at least six bits; and
   dividing the global time base signal into a plurality of separate clock signals further comprises dividing the global time base signal into:
   a first clock signal having a frequency equal to the global time base signal divided by four;
   a second clock signal having a frequency equal to the global time base signal divided by sixteen; and
   a third clock signal having a frequency equal to the global time base signal divided by sixty four.

18. The method of claim 15 wherein providing to each of the plurality of timers, one of the separate clock signals further comprises providing to at least one of the timers the global time base signal.

19. The method of claim 15 wherein the first frequency at which the prescalar counter is incremented comprises a lowest available clock frequency.

20. The method of claim 15 wherein the plurality of components comprise one or more I/O (input/output) devices of a system-on-chip.

21. The method of claim 20 wherein the I/O devices comprise on-chip devices.

22. The method of claim 20 wherein the I/O devices comprise off-chip devices.

* * * * *